(12) United States Patent
Yamada et al.

(10) Patent No.: US 9,231,555 B2
(45) Date of Patent: Jan. 5, 2016

(54) QUARTZ RESONATOR WITH CUT SECTIONS FORMED ON THE SUPPORT ARM

(71) Applicant: SEIKO EPSON CORPORATION, Tokyo (JP)

(72) Inventors: Akinori Yamada, Ina (JP); Shuhei Yoshida, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 38 days.

(21) Appl. No.: 14/313,486

(22) Filed: Jun. 24, 2014

(65) Prior Publication Data

US 2014/0375176 A1   Dec. 25, 2014

(30) Foreign Application Priority Data

Jun. 24, 2013   (JP) .................................. 2013-131935

(51) Int. Cl.
| *H03H 9/21* | (2006.01) |
| *H03H 9/215* | (2006.01) |
| *H03H 9/05* | (2006.01) |
| *H03H 9/10* | (2006.01) |

(52) U.S. Cl.
CPC ............. *H03H 9/215* (2013.01); *H03H 9/0514* (2013.01); *H03H 9/0552* (2013.01); *H03H 9/1014* (2013.01)

(58) Field of Classification Search
CPC ................................. H03H 9/21; H03H 9/215
USPC .......................................... 310/370; 331/156
See application file for complete search history.

(56) References Cited

U.S. PATENT DOCUMENTS

| 7,084,556 B1* | 8/2006 | Dalla Piazza | ............ | H03H 9/21 310/370 |
| 7,112,914 B1* | 9/2006 | Dalla Piazza | ............ | H03H 9/21 310/344 |
| 7,521,846 B2* | 4/2009 | Tanaya | ................ | G01C 19/5607 310/368 |
| 8,460,561 B2* | 6/2013 | Katoh | ........................ | H03H 3/02 216/2 |
| 2004/0085163 A1* | 5/2004 | Kikushima | ........ | G01C 19/5607 333/200 |
| 2009/0077781 A1* | 3/2009 | Amano | ..................... | H03H 3/02 29/25.35 |
| 2011/0001394 A1* | 1/2011 | Dalla Piazza | .......... | H03H 9/215 310/325 |
| 2014/0022024 A1* | 1/2014 | Yamada | .................... | H03B 5/30 331/68 |
| 2014/0192625 A1* | 7/2014 | Tamura | .............. | H03H 9/02157 368/47 |
| 2014/0241132 A1* | 8/2014 | Tamura | ..................... | H03H 9/21 368/47 |
| 2014/0292435 A1* | 10/2014 | Yamada | .................. | H03H 9/215 331/158 |
| 2014/0375177 A1* | 12/2014 | Yamada | .................... | H03H 9/21 310/370 |
| 2015/0137900 A1* | 5/2015 | Yamada | ................. | H03H 9/215 331/156 |

FOREIGN PATENT DOCUMENTS

| EP | 1 732 217 A1 | 12/2006 |
| JP | A-54-013286 | 1/1979 |
| JP | A-62-199107 | 9/1987 |

(Continued)

*Primary Examiner* — J. San Martin
(74) *Attorney, Agent, or Firm* — Oliff PLC

(57) ABSTRACT

A quartz crystal resonator element includes a first electrode pad and a second electrode pad disposed on a lower surface of a support arm, and cut sections disposed in both principal surfaces (upper and lower surfaces) of the support arm between the first and second electrode pads so as to overlap each other, and the cut sections extend so that the support arm is cut from the side surface in the +X-axis direction of the support arm to the −X-axis direction, and are provided with first surfaces roughly perpendicular to the X axis and first and second tilted surfaces extending in the +X-axis direction.

18 Claims, 13 Drawing Sheets

(56) References Cited

FOREIGN PATENT DOCUMENTS

| JP | A-2004-072609 | 3/2002 |
| JP | A-2004-120351 | 4/2004 |
| JP | A-2004-297342 | 10/2004 |
| JP | A-2006-345519 | 12/2006 |
| JP | A-2008-109676 | 5/2008 |
| JP | 2008177723 A * | 7/2008 |
| JP | A-2010-283660 | 12/2010 |

* cited by examiner

QUARTZ RESONATOR WITH CUT SECTIONS FORMED ON THE SUPPORT ARM

CROSS REFERENCE

The entire disclosure of Japanese Patent Application No. 2013-131935 filed Jun. 24, 2013 is expressly incorporated by reference herein.

BACKGROUND

1. Technical Field

The present invention relates to a resonator element, a resonator, an electronic device, an electronic apparatus, and a moving object.

2. Related Art

In small-sized information equipment such as a hard disk drive (HDD), a mobile computer, or an IC card, mobile communication equipment such as a cellular phone, a smartphone, or a tablet terminal, and so on, an electronic device such as a resonator or an oscillator is widely used as a device for providing a timing signal or a sync signal.

In the past, there has been known a device having a resonator element housed in a package as a resonator or an oscillator (see, e.g., JP-A-2006-345519 (Document 1)). The resonator element disclosed in Document 1 has a base section, two vibrating arms extending from the base section so as to be arranged in parallel to each other, and a support arm extending from the base section and located between the two vibrating arms in order to reduce the total length of the resonator element to achieve the miniaturization. Further, each of the vibrating arms has electrodes disposed respectively on four surfaces constituting the periphery of the vibrating arm, and each of the electrodes is connected to either one of two electrode pads disposed side by side on one of principal surfaces of the support arm and having respective polarities opposite to each other via a wiring pattern disposed on a side surface of the support arm. Such a resonator element is fixed to the package in the portions of the two electrode pads via an electrically-conductive adhesive, and is electrically connected to the electrodes on the package side.

Each of the electrodes, the wiring pattern, and the two electrode pads are formed using a photolithography technique and a wet-etching technique.

However, in some cases, the metal in an unwanted area among the metal deposited on the side surface of the support arm fails to be completely removed even using the photolithography technique and the wet-etching technique. In the resonator element disclosed in Document 1, there is caused a problem that the metal, in particular the metal in the area to be separated as opposite polarities in the wiring pattern, fails to be removed. In other words, since the side surface of the support arm is formed roughly perpendicularly to the principal surface roughly along the crystal Z axis of the quartz crystal, it is unachievable to successfully expose a resist film disposed on the surface of the metal thus deposited in the pattern formation of the side surface, and there is caused a problem that the metal in the area from which the metal should be removed fails to be removed as expected. As a result, since the metal which should be removed remains unremoved on the side surface of the support arm, there is a problem that it is unachievable to electrically separate the wiring pattern into the opposite polarities, and as a result the two electrode pads become short-circuited.

Therefore, in JP-A-2004-072609 (Document 2), there is described a technology of removing the metal in the area, which should electrically be separated, in the wiring pattern formed on the predetermined side surface of the resonator element by forming a cutout having a tilted surface.

If the technical concept described in Document 2 is applied to electrical separation of the wiring pattern formed on the side surface of the support arm, a shape shown in FIGS. 14A and 14B is expected. The support arm 23a of the second embodiment has a cut section 118a on the upper surface between first and second electrode pads 37, 38 disposed on the lower surface of the support arm 23a. The cut section 118a extends from a side surface 120a in the +X-axis direction of the support arm 23a toward the −X-axis direction, and is provided with a side surface 119c roughly perpendicular to the X axis, and a tilted surface 119a extending in the +X-axis direction as shown in FIG. 14B.

However, as shown in FIGS. 14A and 14B, since the depth of the tilted surface of the cut section becomes deep, it is necessary to increase the support arm in width direction as a result in order to ensure the strength, and there arises a problem that the miniaturization is difficult.

SUMMARY

An advantage of some aspects of the invention is to solve at least a part of the problems described above, and the invention can be implemented as the following forms or application examples.

Application Example 1

This application example is directed to a quartz crystal resonator element including a base section, a pair of vibrating arms extending from an end portion of the base section in a first direction, and arranged side by side in a second direction intersecting with the first direction, and a support arm extending from the end portion of the base section in the first direction, and arranged between the pair of vibrating arms, wherein the support arm includes a cut section formed in a side surface on a +X-axis side of the support arm by cutting the support arm toward a −X-axis direction, and including a convex tilted portion including a first tilted surface extending from the −X-axis side toward the +X-axis side and tilted from a −Z-axis side of a Z axis toward a +Z-axis side toward the +X-axis direction and a second tilted surface extending from the −X-axis side toward the +X-axis side and tilted from the +Z-axis side toward the −Z-axis side, a first electrode pad and a second electrode pad having polarities opposite to each other, and a first extraction electrode and a second extraction electrode disposed on a side surface on the +X-axis side among side surfaces intersecting with a crystal X axis of quartz crystal, and connected respectively to the first electrode pad and the second electrode pad, and the first extraction electrode and the second extraction electrode are electrically separated from each other in the cut section.

According to this application example, since the cut section with shallow depth and provided with the first tilted surface and the second tilted surface can be obtained, the miniaturization can be achieved.

Application Example 2

This application example is directed to the resonator element according to the application example described above, wherein the first tilted surface and the second tilted surface are each tilted in a stepwise fashion.

According to this application example, since the length in the Z-axis direction of the surface along the Z-axis direction of the cut section can be reduced, the exposure with respect to the surface along the Z-axis direction becomes easy.

Application Example 3

This application example is directed to the resonator element according to the application example described above, wherein the cut section is disposed at least one of between the first electrode pad and the second electrode pad and between a tip of the support arm and the first electrode pad in a planar view.

According to this application example, there is an advantage that the two electrode pads can electrically be separated with higher certainty.

Application Example 4

This application example is directed to the resonator element according to the application example described above, wherein the first tilted surface and the second tilted surface overlap each other in a planar view.

According to this application example, there is an advantage that the two electrode pads can electrically be separated with higher certainty to achieve miniaturization.

Application Example 5

This application example is directed to the resonator element according to the application example described above, wherein a length L1 of the cut section along a crystal Y-axis direction is 5 μm or more and 500 μm or less.

According to this application example, by setting the length L1 along the crystal Y-axis direction of the cut section within a range of 5 μm or more and 500 μm or less, there is an advantage that the miniaturization can be achieved while electrically separating the two electrode pads from each other.

Application Example 6

This application example is directed to the resonator element according to the application example described above, wherein the length L1 is 20 μm or more and 100 μm or less.

According to this application example, by setting the length L1 along the crystal Y-axis direction of the cut section within a range of 20 μm or more and 100 μm or less, there is an advantage that the further miniaturization can be achieved.

Application Example 7

This application example is directed to the resonator element according to the application example described above, wherein a width W1 of the cut section along a crystal X-axis direction is 5 μm or more and 300 μm or less.

According to this application example, by setting the width W1 along the crystal X-axis direction of the cut section within a range of 5 μm or more and 300 μm or less, there is an advantage that the miniaturization can be achieved while electrically separating the two electrode pads from each other with certainty.

Application Example 8

This application example is directed to the resonator element according to the application example described above, wherein the width W1 is 10 μm or more and 50 μm or less.

According to this application example, by setting the width W1 along the crystal X-axis direction of the cut section within a range of 10 μm or more and 50 μm or less, there is an advantage that the further miniaturization can be achieved.

Application Example 9

This application example is directed to the resonator element according to the application example described above, wherein a plurality of the cut sections is provided to the support arm.

According to this application example, since the electrode on the side surface of the support arm can more surely be removed by providing the support arm with the plurality of cut sections each having the tilted portion, there is an advantage that the short circuit between the two electrode pads can be prevented.

Application Example 10

This application example is directed to a resonator including the resonator element according to the application example described above, and a container adapted to house the resonator element.

According to this application example, since the influence of a disturbance such as a temperature variation or a humidity variation, and the influence of contamination can be prevented by housing the resonator element in the container, there is an advantage that the resonator superior in frequency reproducibility, frequency-temperature characteristic, CI-temperature characteristic, and frequency-aging characteristic can be obtained.

Application Example 11

This application example is directed to an electronic device including the resonator element according to the application example described above, and a circuit.

According to this application example, since the electronic device can be constituted by the resonator element, miniaturization of which can be achieved, the oscillator circuit for exciting the resonator element, and so on, there is an advantage that a small-sized electronic device having a stable oscillation characteristic can be obtained.

Application Example 12

This application example is directed to an electronic apparatus including the resonator element according to the application example described above.

According to this application example, since the small-sized resonator element is used, there is an advantage that an electronic apparatus equipped with the small-sized electronic device having a stable oscillation characteristic can be configured.

Application Example 13

This application example is directed to a moving object including the resonator element according to the application example described above.

According to this application example, since the small-sized resonator having the small-sized resonator element, and superior in frequency reproducibility and frequency-aging characteristic can be used, there is an advantage that a moving object provided with a stable and accurate electronic control unit can be configured.

BRIEF DESCRIPTION OF THE DRAWINGS

The invention will be described with reference to the accompanying drawings, wherein like numbers reference like elements.

FIGS. 1A and 1B are schematic diagrams showing a structure of a resonator element according to a first embodiment of the invention, wherein FIG. 1A is a plan view, and FIG. 1B is a cross-sectional view along the A-A line.

FIGS. 2A and 2B are plan views showing an electrode configuration of the resonator element according to the first embodiment of the invention, wherein FIG. 2A is a top view, and FIG. 2B is a bottom view (a transparent view).

FIGS. 5A through 5C are schematic diagrams showing a structure of the support arm of the resonator element according to the first embodiment of the invention, wherein FIG. 5A is a plan view, FIG. 53 is a side view viewed from the +X-axis direction, and FIG. 5C is a cross-sectional view along the C-C line shown in FIG. 5A.

FIGS. 6A and 6B are schematic diagrams showing a structure of a support arm of a resonator element according to a second embodiment of the invention, wherein FIG. 6A is a plan view, and FIG. 6B is a cross-sectional view along the E-E line shown in FIG. 6A.

FIGS. 7A and 7B are schematic diagrams showing a structure of a support arm of a resonator element according to a third embodiment of the invention, wherein FIG. 7A is a plan view, and FIG. 7B is a cross-sectional view along the F-F line shown in FIG. 7A.

FIGS. 8A and 8B are schematic diagrams showing a structure of the resonator according to an embodiment of the invention, wherein FIG. 8A is a plan view, and FIG. 8B is a cross-sectional view along the G-G line shown in FIG. 8A.

FIGS. 14A and 14B are schematic diagrams showing the structure of the support arm of the resonator element according to the related art, wherein FIG. 14A is a plan view, and FIG. 14B is a cross-sectional view along the D-D line shown in FIG. 14A.

DESCRIPTION OF EXEMPLARY EMBODIMENTS

Some embodiments of the invention will hereinafter be explained in detail with reference to the accompanying drawings.

Resonator Element

First Embodiment

Figure 1A:
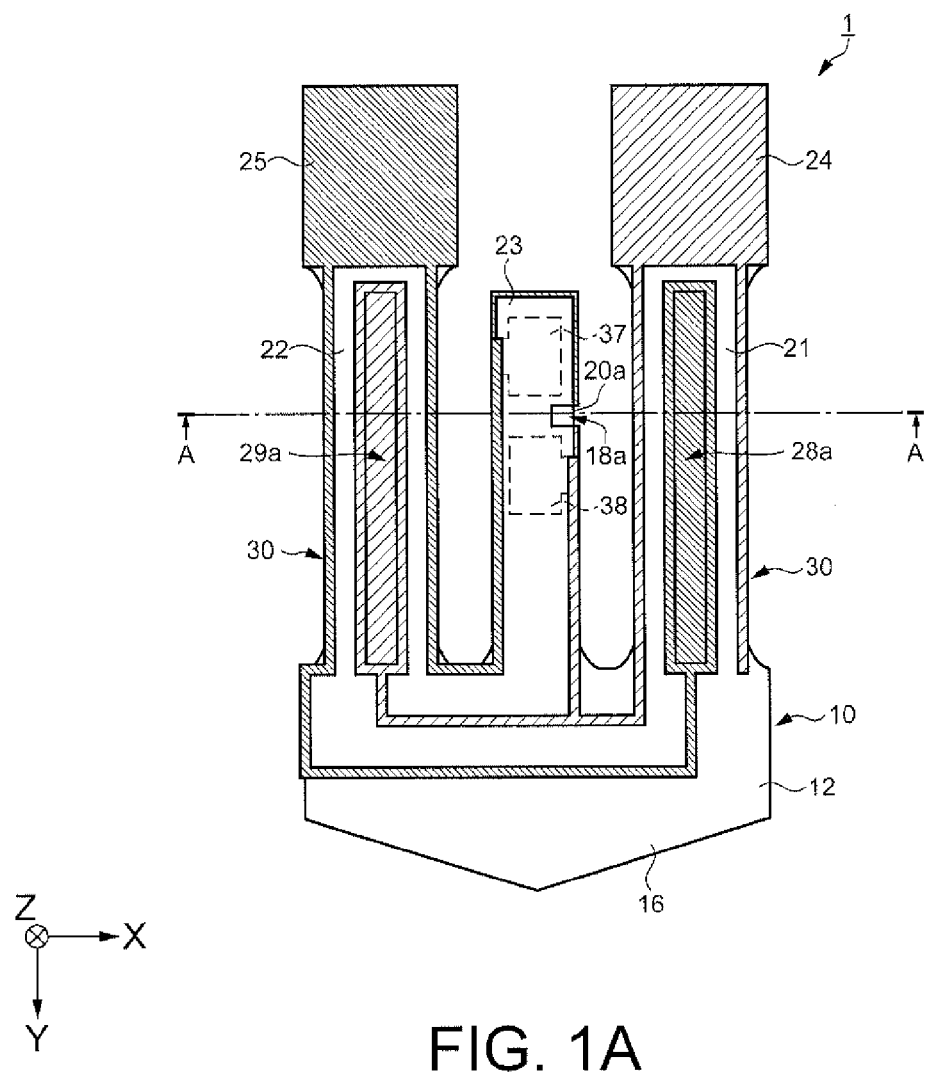
Figure 1B:
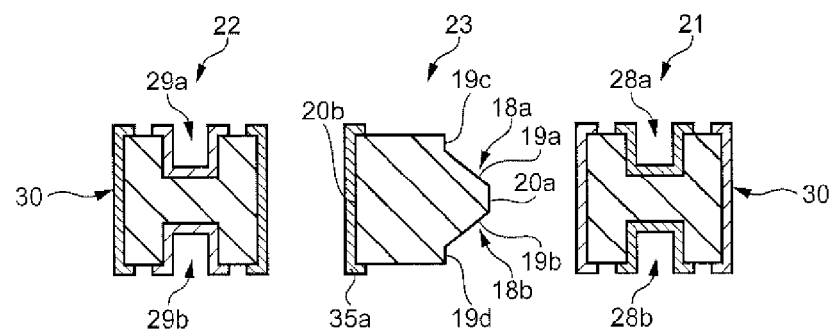
Figures 2A, 2B:
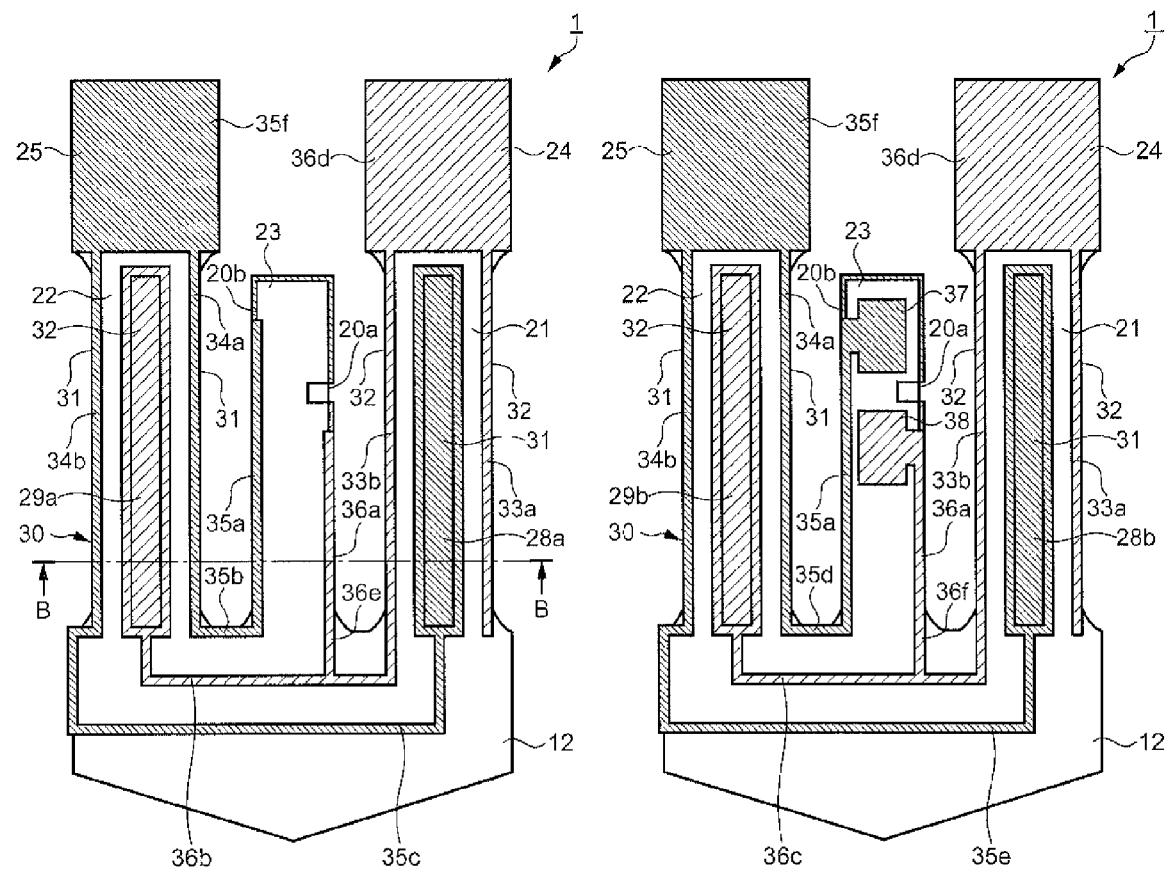
Figure 3:
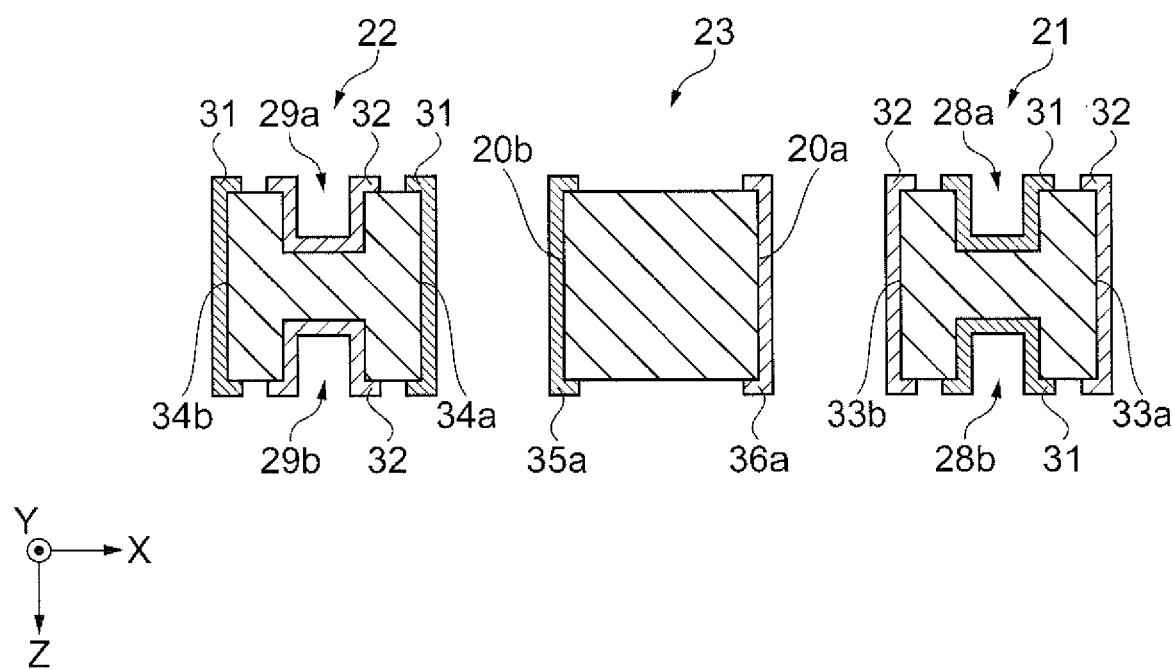
FIG. 3 is a cross-sectional view along the B-B line in FIG. 2A.

FIGS. 1A and 1B are schematic diagrams showing a structure of a resonator element according to a first embodiment of the invention, wherein FIG. 1A is a plan view, and FIG. 1B is a cross-sectional view along the A-A line shown in FIG. 1A. FIGS. 2A and 2B are plan views of the resonator element according to the first embodiment of the invention, wherein FIG. 2A is a top view, and FIG. 2B is a bottom view (a transparent view). FIG. 3 is a cross-sectional view along the B-B line shown in FIG. 2A. FIGS. 4A through 4D are cross-sectional views for explaining a method of manufacturing the resonator element shown in FIGS. 1A and 1B. It should be noted that in each of the drawings, the X axis, the Y axis, and the Z axis are shown as the three axes perpendicular to each other for the sake of convenience of explanation. Further, the planar view viewed from the Z-axis direction is also referred to simply as a "planar view" in the following explanation for the sake of convenience of explanation. Further, for the sake of convenience of explanation, in the following explanation, the surface in the −Z-axis direction is referred to as an upper surface, and the surface in the +Z-axis direction is referred to as a lower surface in the planar view viewed from the Z-axis direction.

The resonator element 1 shown in FIGS. 1A and 1B is composed of a vibrating substrate 10 provided with a base section 12, vibrating arms 21, 22, weight sections 24, 25, and a support arm 23, and electrodes 30 for driving disposed on the vibrating substrate 10.

The vibrating substrate 10 is formed of a quartz crystal substrate, in particular a Z-cut quartz crystal plate as, for example, a piezoelectric substrate. Thus, the resonator element 1 can exert superior vibration characteristics. The Z-cut quartz crystal plate is a quartz crystal substrate having the Z axis (the optical axis) of the quartz crystal coinciding with the thickness direction. Although it is preferable for the Z axis to coincide with the thickness direction of the vibrating substrate 10, it is required to slightly (e.g., roughly 15° or smaller) tilt the Z axis with respect to the thickness direction from the viewpoint of reducing the frequency-temperature variation in the vicinity of the room temperature.

The vibrating substrate 10 has the base section 12, the two vibrating arms 21, 22 projecting from the base section 12 toward the −Y-axis direction and disposed side by side in the X-axis direction, and a support arm 23 projecting from the base section 12 toward the −Y-axis direction, and located between the two vibrating arms 21, 22.

The base section 12 spreads in the X-Y plane, and has a roughly plate-like shape having a thickness in the Z-axis direction. The base section 12 of the present embodiment has a shrunk-width portion 16 having the width gradually decreasing toward the +Y-axis direction disposed on the opposite side to the vibrating arms 21, 22 and the support arm 23. Since such a shrunk-width portion 16 is provided, the vibration leakage can be suppressed. Further, the contour of the shrunk-width portion 16 can be provided with a projecting section or a recessed section (a cutout). It should be noted that the shrunk-width portion 16 can be provided as needed, and can also be eliminated.

The vibrating arms 21, 22 are disposed side by side in the X-axis direction, and each extend (project) from the base section 12 in the −Y-axis direction. Further, at the tips of the vibrating arms 21, 22, there are disposed weight sections 24, 25, respectively. By providing such weight sections 24, 25, the miniaturization of the resonator element 1 can be achieved, and the frequency of the flexural vibration of the vibrating arms 21, 22 can be lowered. It should be noted that the weight sections 24. 25 can each have a plurality of widths as needed, or can also be eliminated.

Further, both of principal surfaces of the vibrating arms 21, 22 are provided with grooves 28a, 28b, 29a, and 29b each having a bottom and opening in the principal surface. These grooves 28a, 28b, 29a, and 29b are disposed so as to extend in the Y-axis direction, and have the same shape as each other. Therefore, as shown in FIG. 1B, the vibrating arms 21, 22 each have a roughly "H" shaped lateral cross-sectional shape.

By forming such grooves 28a, 28b, 29a, and 29b, it becomes difficult for the heat generated by the flexural vibration to diffuse (make heat conduction), and thus, a thermoelastic loss can be suppressed in the heat insulating area, which is an area where the flexural vibration frequency (the mechanical flexural vibration frequency) f is higher than a thermal relaxation frequency f0 (f>f0). It should be noted that the grooves 28a. 28b, 29a, and 29b can be provided as needed, and can also be eliminated.

The support arm 23 extends from the base section 12 in the −Y-axis direction, and is located between the vibrating arms 21, 22. Further, the support arm 23 has an elongated shape, and has a roughly uniform width (length in the X-axis direction) throughout the entire area in the longitudinal direction. Further, the support arm 23 is provided with first and second electrode pads 37, 38 disposed on the lower surface of the support arm 23, and cut sections 18a, 18b are disposed between the first and second electrode pads 37, 38 in the both principal surfaces (the upper and lower surfaces) of the support arm 23 so as to overlap each other in the planar view.

The cut includes the cut sections 18a, 18b, and extends so that the support arm 23 is cut in from the side surface 20a on the +X-axis side of the support arm 23 in the −X-axis direction, and is provided with first surfaces 19c, 19d roughly perpendicular to the X axis and first and second tilted surfaces 19a, 19b extending in the +X-axis direction.

The cut section 18a has the first tilted surface 19a tilted from the −Z-axis side of the Z axis toward the +Z-axis side toward the +X-axis direction.

The cut section 18b has the second tilted surface 19b tilted from the +Z-axis side toward the −Z-axis side toward the +X-axis direction.

In the resonator element 1 according to the invention, the width in the X-axis direction of the support arm 23 is made as short as possible, and the two vibrating arms 21, 22 disposed on both sides of the support arm 23 are disposed as close as possible in order to achieve the miniaturization. Specifically, if the depth in the X-axis direction of the cut provided to the support arm 23 is shallow (if the width of the cut is short), it becomes possible to shorten the width in the X-axis direction of the support arm 23 while keeping the strength, which is therefore very effective for the miniaturization.

Further, if the depth in the X-axis direction of the cut is shallow, it is possible to avoid losing the balance of the both sides in the X-axis direction of the support arm 23, and therefore, the flexural vibration of the vibrating arms 21, 22 is stabilized.

Hereinabove, the configuration of the resonator element 1 is briefly explained. Then, the electrodes 30 disposed on the vibrating substrate 10 will be explained.

FIGS. 2A and 2B are plan views showing an electrode configuration of the resonator element according to the first embodiment of the invention, wherein FIG. 2A is a top view, and FIG. 2B is a bottom view (a transparent view) of FIG. 2A. Further, FIG. 3 is a cross-sectional view along the B-B line shown in FIG. 2A.

As shown in FIGS. 2A, 2B, and 3, the electrodes 30 include a plurality of first driving electrodes 31, the first electrode pad 37, wiring patterns 35a, 35b, 35c, 35d, 35e, and 35f as first extraction electrodes for connecting the plurality of first driving electrodes 31 and the first electrode pad 37 to each other, a plurality of second driving electrodes 32, the second electrode pad 38, wiring patterns 36a, 36b, 36c, 36d, 36e, and 36f as second extraction electrodes for connecting the plurality of second driving electrodes 32 and the second electrode pad 38 to each other.

The first driving electrodes 31 are disposed on the respective internal surfaces of the grooves 28a, 28b of the vibrating arm 21, and the respective side surfaces 34a, 34b of the vibrating arm 22. The first driving electrode 31 on the groove 28a is connected to the first driving electrode 31 on the side surface 34b via the wiring pattern 35c disposed straddling the upper surface and the side surface of the base section 12, and the first driving electrode 31 on the groove 28b is connected to the first driving electrode 31 on the side surface 34b via the wiring pattern 35e disposed straddling the lower surface and the side surface of the base section 12. It should be noted that the wiring patterns 35c, 35e are connected to each other on the side surface of the base section 12.

Then, the first driving electrode 31 on the side surface 34b is connected to the first driving electrode 31 on the side surface 34a via the wiring pattern 35f disposed on the weight section 25. Further, the first driving electrode 31 on the side surface 34a is connected to the wiring pattern 35a disposed on the upper and lower surfaces and the side surface 20b of the support arm 23 via the wiring patterns 35b, 35d disposed respectively on the upper surface and the lower surface of the base section 12. Further, the wiring pattern 35a is electrically connected to the first electrode pad 37 disposed on the lower surface of the support arm 23.

Meanwhile, the second driving electrodes 32 are disposed on the respective internal surfaces of the grooves 29a, 29b of the vibrating arm 22, and the side surfaces 33a, 33b of the vibrating arm 21. The second driving electrode 32 on the groove 29a is connected to the second driving electrode 32 on the side surface 33b via the wiring pattern 36b disposed on the upper surface of the base section 12, and the second driving electrode 32 on the groove 29b is connected to the second driving electrode 32 on the side surface 33b via the wiring pattern 36c disposed on the lower surface of the base section 12.

Then, the second driving electrode 32 disposed on the side surface 33b is connected to the second driving electrode 32 disposed on the side surface 33a via the wiring pattern 36d disposed on the weight section 24. Further, the wiring pattern 36b on the upper surface of the base section 12 is connected to the wiring pattern 36a disposed on the upper and lower surfaces and the side surface 20a of the support arm 23 via the wiring pattern 36e disposed on the upper surface of the base section 12, and the wiring pattern 36c on the lower surface of the base section 12 is connected to the wiring pattern 36a via the wiring pattern 36f disposed on the lower surface of the base section 12. Further, the wiring pattern 36a is electrically connected to the second electrode pad 38 disposed on the lower surface of the support arm 23.

Thus, by applying a drive voltage from the first and second electrode pads 37, 38 to the first and second driving electrodes 31, 32 via the wiring patterns, an electric field is appropriately generated inside the vibrating arms of the resonator element 1, and the two vibrating arms 21, 22 vibrate at a predetermined frequency in a roughly in-plane direction (in the X-Y plane direction) so as to repeat getting closer to and away from each other.

The constituent material of the electrodes 30 is not particularly limited, and there can be used a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), or zirconium (Zr), and an electrically-conductive material such as indium tin oxide (ITO).

The structure of the resonator element 1 is hereinabove explained. Such a resonator element 1 can be manufactured in the following manner. It should be noted that the manufacturing method explained hereinafter is illustrative only, and it is also possible to manufacture the resonator element 1 using other manufacturing methods.

FIGS. 4A through 4D are cross-sectional views of the vibrating arms 21, 22 provided with the grooves 28a, 28b, 29a, and 29b and the support arm 23 for explaining the method of manufacturing the resonator element 1 according to the first embodiment of the invention.

Figure 4A:
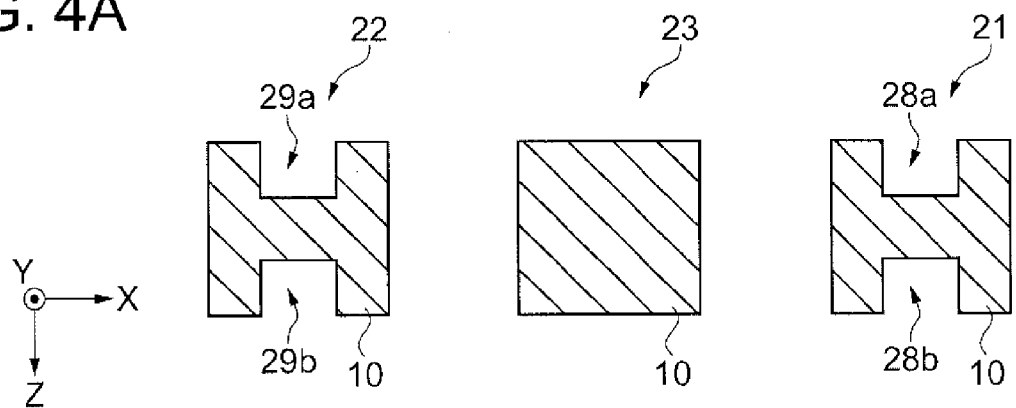
FIGS. 4A through 4D are cross-sectional views of vibrating arms and a support arm, and showing a method of manufacturing the resonator element according to the first embodiment of the invention.

Firstly, as shown in FIG. 4A, the vibrating substrate 10 is prepared. The vibrating substrate 10 can be manufactured by performing the patterning of the outer shape of the resonator element on the Z-cut quartz crystal plate, and then performing a wet-etching process.

Figure 4B:
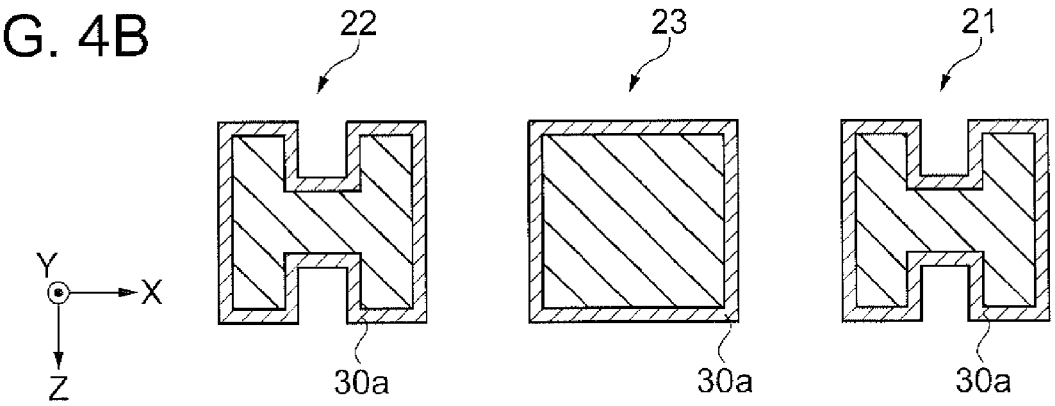

Then, as shown in FIG. 4B, the electrode film 30a is deposited on the entire surfaces of the vibrating substrate 10 by, for example, evaporation or sputtering.

Figure 4C:
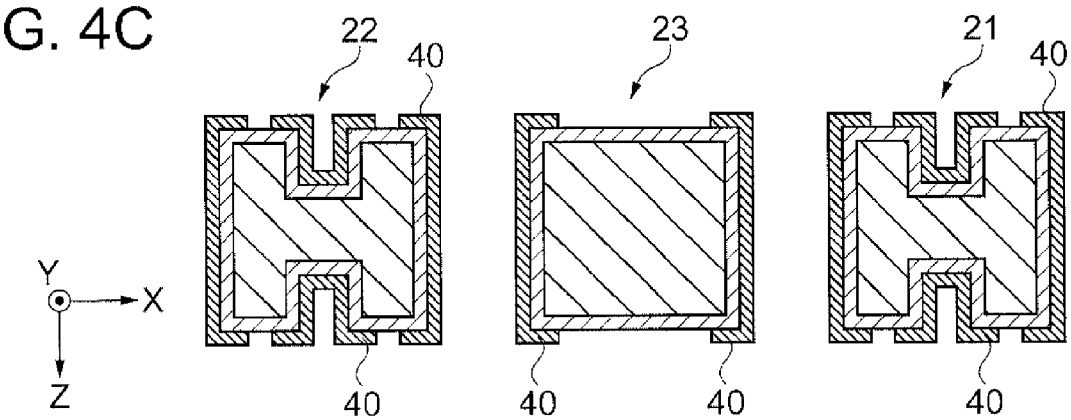

Subsequently, as shown in FIG. 4C, by applying a resist film 40 (a positive type photoresist film) on the electrode film 30a, and then patterning the resist film 40 by exposure and development, the resist pattern corresponding to the shapes of the electrodes 30 is formed.

Figure 4D:
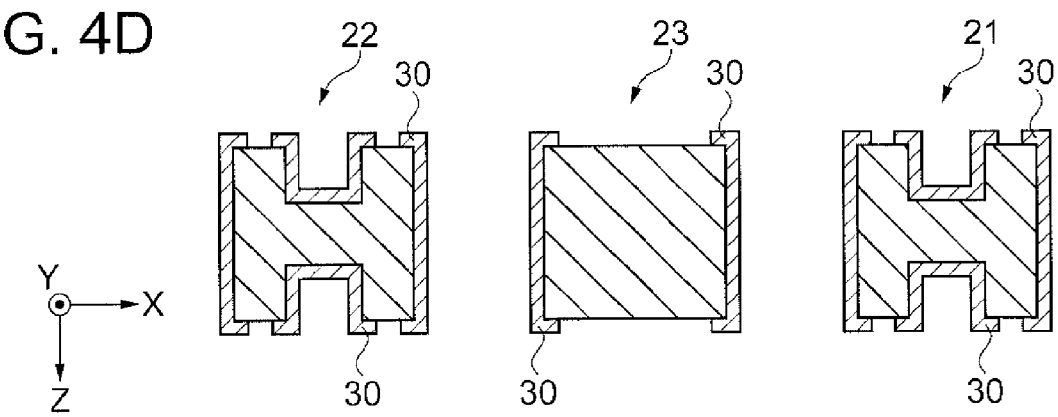

Subsequently, by performing the wet-etching to thereby remove a part of the electrode film 30a exposed from the resist pattern, and then removing the resist pattern, the electrodes 30 are formed. According to the process described hereinabove, the resonator element 1 provided with the electrodes 30 can be obtained as shown in FIG. 4D.

Then, the structure of the support arm 23 of the resonator element 1 according to the invention will be explained in detail.

Figure 5A:
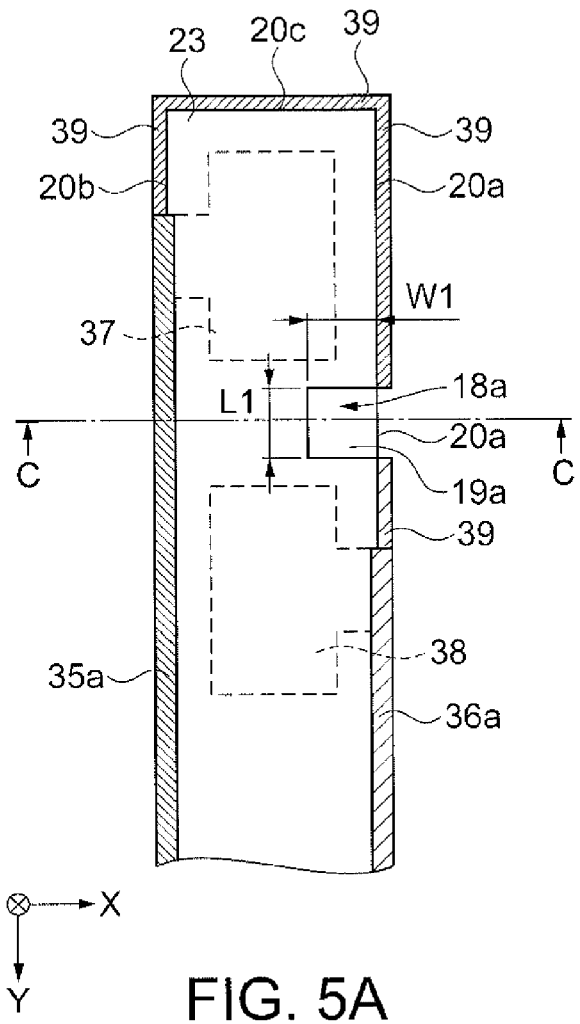
Figure 5B:
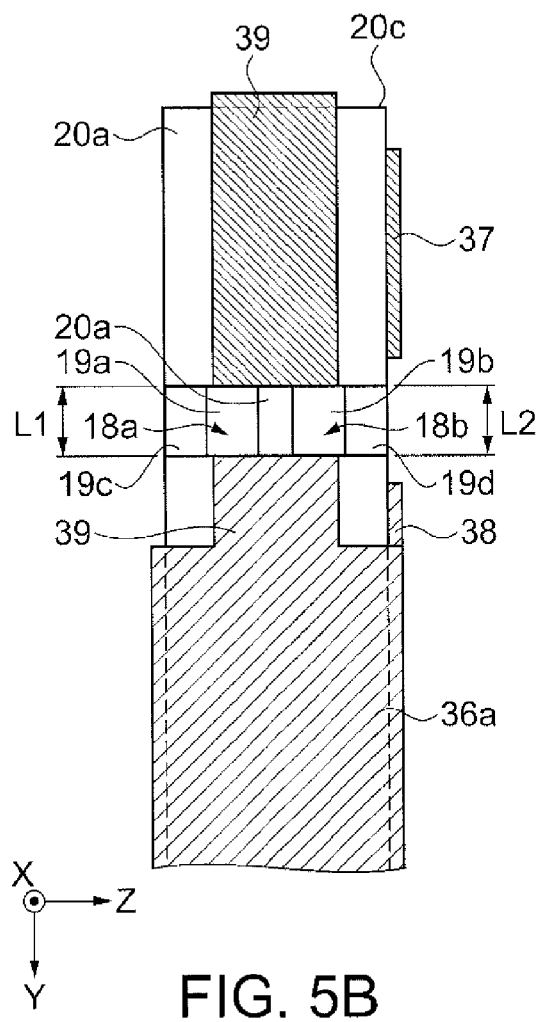
Figure 5C:
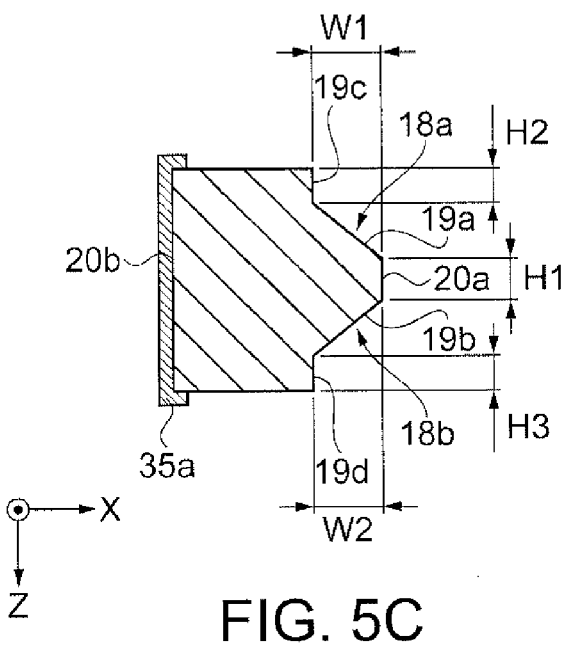

FIGS. 5A through 5C are schematic diagrams showing the structure of the support arm of the resonator element according to the first embodiment of the invention, wherein FIG. 5A is a plan view, FIG. 5B is a side view of FIG. 5A viewed from the +X-axis direction, and FIG. 5C is a cross-sectional view along the C-C line shown in FIG. 5A.

The cut sections 18a, 18b disposed between the first and second electrode pads 37, 38 disposed on the lower surface of the support arm 23 so as to overlap each other in the planar view prevent the short circuit between the first and second electrode pads 37, 38 due to a side surface electrode 39 remaining on the side surfaces 20a, 20b roughly perpendicular to the X-axis direction of the support arm 23 and the side surface 20c roughly perpendicular to the Y-axis direction when forming the electrodes 30.

Specifically, the side surface electrode 39 deposited on the side surfaces 20a, 20b, and 20c roughly perpendicular to the principal surfaces of the support arm 23 is extremely difficult to be completely removed by an ordinary exposure device without using an oblique exposure device or the like in the photolithography process for forming the electrodes 30 (the first and second electrode pads 37, 38 and the wiring patterns 35a, 36a for connecting the electrodes to each other in FIGS. 5A through 5C) explained with reference to FIGS. 4A through 4D. This is because the side surfaces 20a, 20b, and 20c of the support arm 23 covered by the resist film 40 are not completely exposed. Although in the area displaced within about 20 μm from the principal surfaces of the support arm 23 in the thickness direction, the exposure can be performed by the ordinary exposure device, and the side surface electrode 39 can be removed, since it is difficult for the light to reach the region reaching the center in the thickness direction, and the exposure of the region is unachievable, the side surface electrode 39 remains to shunt the first and second electrode pads 37, 38 with each other.

Therefore, by disposing the cut section 18a provided with the tilted portion having the first tilted surface 19a and the first surface 19c, and the cut section 18b provided with the tilted portion having the second tilted surface 19b and the first surface 19d, and setting the dimensions H1, H2, and H3 in the Z-axis direction of the side surface 20a roughly perpendicular to the principal surfaces of the support arm 23 and the first surfaces 19c, 19d to be equal to or smaller than 20 μm as shown in FIG. 5C, the exposure can be achieved by the ordinary exposure device. Therefore, it becomes possible to remove the side surface electrode 39 to prevent the short circuit between the first and second electrode pads 37, 38.

The formation of the cut section 18a including the tilted portion having the first tilted surface 19a and the first surface 19c, and the cut section 18b including the tilted portion having the second tilted surface 19b and the first surface 19d can be achieved by wet-etching the vibrating substrate 10 formed of the Z-cut quartz crystal plate. By simultaneously etching the obverse and reverse sides of the substrate, the etching time can be reduced.

In general, since the quartz crystal has an etching anisotropy, the etching rate is different by the direction of the crystal axis. Therefore, if the Z-cut quartz crystal plate is used, the shapes of the side surfaces 33a, 33b, 34a, and 34b roughly perpendicular to the X-axis direction of the vibrating arms 21, 22 shown in FIGS. 2A and 2B are different from each other assuming that the crystal X axis of the quartz crystal is the X axis shown in FIGS. 2A and 2B, the crystal Y axis of the quartz crystal is the Y axis shown in FIGS. 2A and 2B, and the crystal Z axis of the quartz crystal is the Z axis shown in FIGS. 2A and 2B. Specifically, the side surfaces 33a, 34a in the +X-axis direction and the side surfaces 33b, 34b in the −X-axis direction are different in shape from each other, and the shape of the side surfaces 33b, 34b in the −X-axis direction is a roughly flat shape on the one hand, the shape of the side surfaces 33a, 34a in the +X-axis direction is provided with a convex tilted portion such as a projection section having a triangular pyramid shape, which decreases in size as the wet-etching time increases, formed in the central portion in the thickness direction (the Z-axis direction) on the other hand.

In particular, in the X-Z cross-sectional surface of the vibrating arms 21, 22, the side surfaces 33a, 34a in the +X-axis direction each have two tilted surfaces, namely a tilted surface roughly perpendicular to the principal surfaces of the vibrating arms 21, 22, and a tilted surface forming the projection having the triangular pyramid shape. It should be noted that in the case of forming the outer shape of the resonator element 1, the wet-etching for a long period of time is performed to ensure the symmetric property of the cross-sectional shape of the vibrating arms 21, 22 in order to prevent the vibration leakage caused by the asymmetric nature of the cross-sectional shape of the vibrating arms 21, 22.

Therefore, as shown in FIG. 5B, in the formation of the cut sections 18a, 18b, the tilted portion having the first and second tilted surfaces 19a, 19b caused by the etching anisotropy of the quartz crystal and extending in the +X-axis direction and the first and second surfaces 19c, 19d having the tilted surfaces roughly perpendicular to the principal surfaces of the support arm 23 can intentionally be formed by setting a short wet-etching time. In particular, the cut sections 18a, 18b can efficiently be formed together with the grooves 28a, 28b, 29a, and 29b.

It should be noted that in the area where the cut sections 18a, 18b are disposed, the dimensions H1, H2, and H3 in the Z-axis direction of the side surface 20a and the first and second surfaces 19c, 19d are preferably equal to or smaller than 20 μm, and more preferably equal to or smaller than 10 μm. Further, since the miniaturization can be achieved while providing the minimum required length of the opening section for the etching to proceed, the dimensions L1, L2 in the Y-axis direction of the cut sections 18a, 18b are preferably in a range of 5 through 500 μm, and more preferably in a range of 20 through 100 μm with which the etching easily proceeds, and further miniaturization can be achieved. Further, since the miniaturization can be achieved while providing the minimum required length of the opening section for the etching to proceed, the dimensions W1, W2 in the X-axis direction of the cut sections 18a, 18b are preferably in a range of 5 through 300 μm, and more preferably in a range of 10 through 50 μm with which the etching easily proceeds, and further miniaturization can be achieved.

Second Embodiment

Then, a second embodiment of the invention will be explained.

Figure 6A:
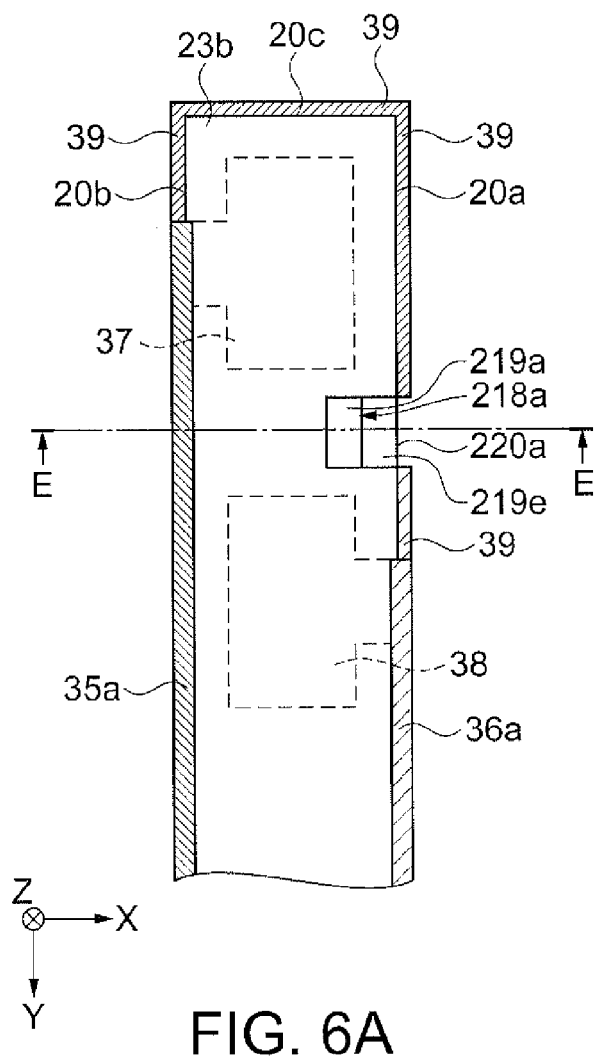
Figure 6B:
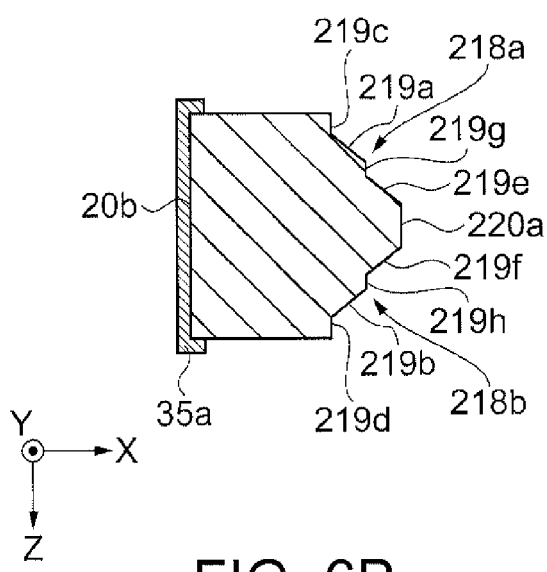

FIGS. 6A and 63 are schematic diagrams showing a structure of a support arm of a resonator element according to the second embodiment of the invention, wherein FIG. 6A is a plan view, and FIG. 6B is a cross-sectional view along the E-E line shown in FIG. 6A.

Hereinafter, the second embodiment will be explained mainly focused on the differences from the first embodiment described above, and the explanation of substantially the same matters will be omitted.

The second embodiment is substantially the same as the first embodiment except the point that the configuration (the shape) of the support arm 23b is different. It should be noted that in FIGS. 6A and 6B, the constituents substantially identical to those of the first embodiment described above are denoted with the same reference symbols.

The support arm 23b of the second embodiment shown in FIGS. 6A and 63 has cut sections 218a, 218b in the both surfaces (the upper and lower surfaces) between the first and second electrode pads 37, 38 disposed on the lower surface of the support arm 23b so as to overlap each other in the planar view. The cut sections 218a, 218b extend from the side surface 220a in the +X-axis direction of the support arm 23b in the −X-axis direction, and as shown in FIG. 6B, the cut section 218a is provided with a first surface 219c and a second surface 219g having tilted surfaces roughly perpendicular to the X axis, and a tilted portion having a first tilted surface 219a and a third tilted surface 219e extending in the +X-axis direction. Further, the cut section 218b is provided with a first surface 219d and a second surface 219h having tilted surfaces roughly perpendicular to the X-axis, and a tilted portion having a second tilted surface 219b and the fourth tilted surface 219f extending in the +X-axis direction.

Therefore, since the second surface 219g as a step surface exists between the first tilted surface 219a and the third tilted surface 219e, the first tilted surface 219a and the third tilted surface 219e constitute a stepped tilted surface. Since the second surface 219h as a step surface exists between the second tilted surface 219b and the fourth tilted surface 219f, the second tilted surface 219b and the fourth tilted surface 219f constitute a stepped tilted surface.

The difference from the support arm 23 of the first embodiment shown in FIGS. 5A through 5C is that the two cut sections 218a, 218b are each constituted (constituted in two steps) with the tilted portion having the four tilted surfaces.

According to such a configuration, since the dimensions in the Z-axis direction of the first and second surfaces 219c, 219d, 219g, and 219h each having the tilted surface roughly perpendicular to the X-axis can be made smaller, the exposure becomes easy to perform. Therefore, the short circuit between the first and second electrode pads 37, 38 due to the side surface electrode 39 remaining on the side surfaces 20a, 20b roughly perpendicular to the X-axis direction of the support arm 23b, and the side surface 20c roughly perpendicular to the Y-axis direction can be prevented by removing a part of the side surface electrode 39 in the side surface 220a.

It should be noted that although the cut sections 218a, 218b each have the tilted surfaces roughly perpendicular to the X axis and the tilted surfaces extending in the +X-axis direction so as to form the two-stage configuration, a three-stage configuration and a four-stage configuration can also be adopted.

Third Embodiment

Then, a third embodiment of the invention will be explained.

Figure 7A:
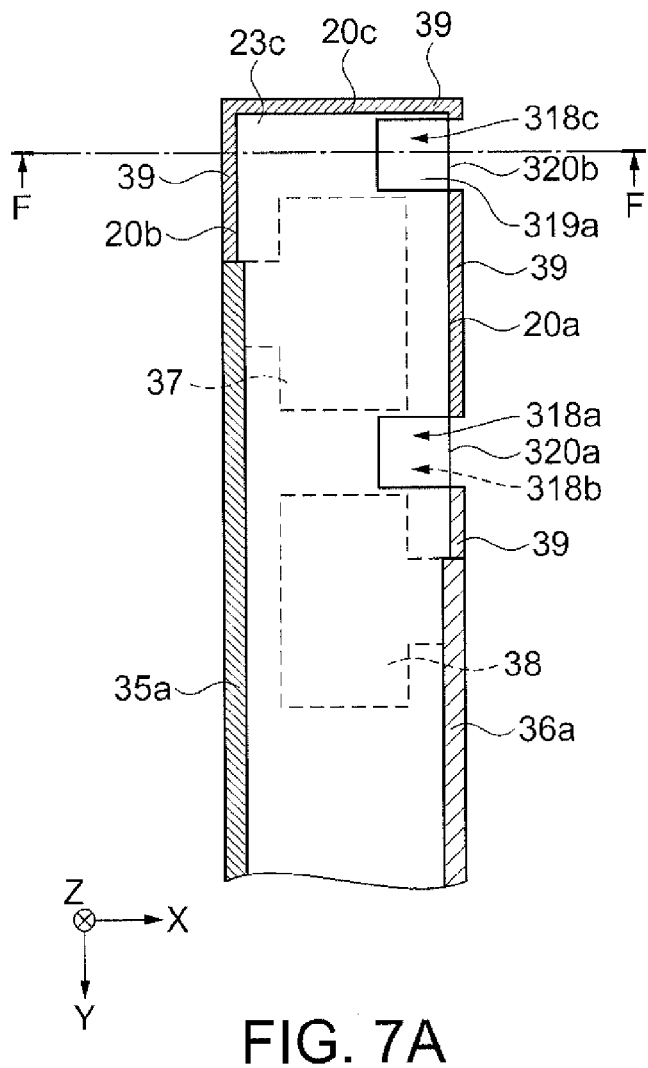
Figure 7B:
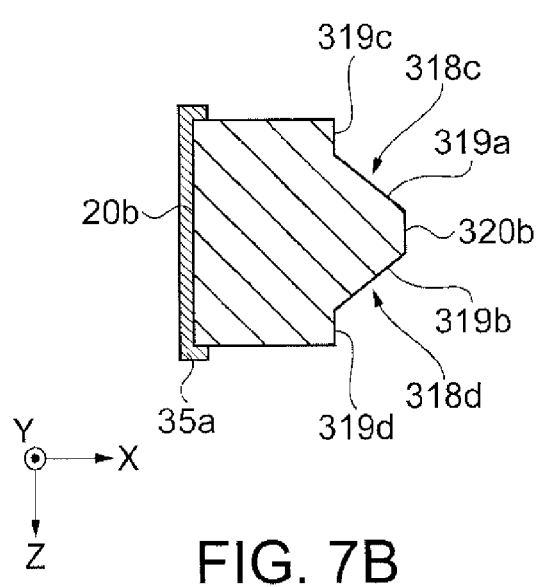

FIGS. 7A and 7B are schematic diagrams showing a structure of a support arm of a resonator element according to the third embodiment of the invention, wherein FIG. 7A is a plan view, and FIG. 7B is a cross-sectional view along the F-F line shown in FIG. 7A.

Hereinafter, the third embodiment will be explained mainly focused on the differences from the first embodiment described above, and the explanation of substantially the same matters will be omitted.

The third embodiment is roughly the same as the first embodiment except the point that the configuration (the shape) of the support arm 23c is different. It should be noted that in FIGS. 7A and 7B, the components substantially identical to those of the first embodiment described above are denoted with the same reference symbols.

The support arm 23c of the third embodiment shown in FIGS. 7A and 7B has cut sections 318a, 318b in the both surfaces (the upper and lower surfaces) between the first and second electrode pads 37, 38 disposed on the lower surface of the support arm 23c so as to overlap each other in the planar view. Further, the support arm 23c has cut sections 318c, 318d in the both surfaces (the upper and lower surfaces) between the first electrode pad 37 disposed on the lower surface of the support arm 23c and the side surface 20c roughly perpendicular to the Y-axis direction of the support arm 23c so as to overlap each other in the planar view. The cut sections 318a, 318b extend from the side surface 320a in the +X-axis direction of the support arm 23c to the −X-axis direction.

Further, the cut sections 318c, 318d extend from the side surface 320b in the +X-axis direction of the support arm 23c to the −X-axis direction, and are provided with first and second surfaces 319c, 319d having tilted surfaces roughly perpendicular to the X axis, and a tilted portion having first and second tilted surfaces 319a, 319b extending in the +X-axis direction as shown in FIG. 7B.

The difference from the first embodiment shown in FIGS. 5A through 5C is that the cut sections 318c, 318d are disposed in the both surfaces (the upper and lower surfaces) between the first electrode pad 37 disposed on the lower surface of the support arm 23c and the side surface 20c roughly perpendicular to the Y-axis direction of the support arm 23c so as to overlap each other in the planar view, and thus, the support arm 23c is provided with the four cut sections 318a, 318b, 318c, and 318d.

According to such a configuration, since the side surface electrode 39 remaining on the side surface 20a roughly perpendicular to the +X-axis direction of the support arm 23c can be removed in the two places, namely the side surfaces 320a, 320b, the short circuit between the first and second electrode pads 37, 38 due to the side surface electrode 39 remaining on the side surfaces 20a, 20b roughly perpendicular to the X-axis direction of the support arm 23c and the side surface 20c roughly perpendicular to the Y-axis direction can more surely be prevented similarly to the first embodiment.

It should be noted that the cut sections 318a, 318b and the cut sections 318c, 318d are each disposed in the both surfaces (the upper and lower surfaces) of the support arm 23c so as to overlap each other, but cal also be disposed in either one of the upper and lower surfaces instead of the both surfaces (the upper and lower surfaces). Further, it is also possible to shorten the dimensions in the Y-axis direction of the cut sections 318a, 318b, 318c, and 318d to additionally dispose four or more cut sections.

Resonator

Then, the resonator 2 to which the resonator element 1 according to the invention is applied will be explained.

Figure 8A:
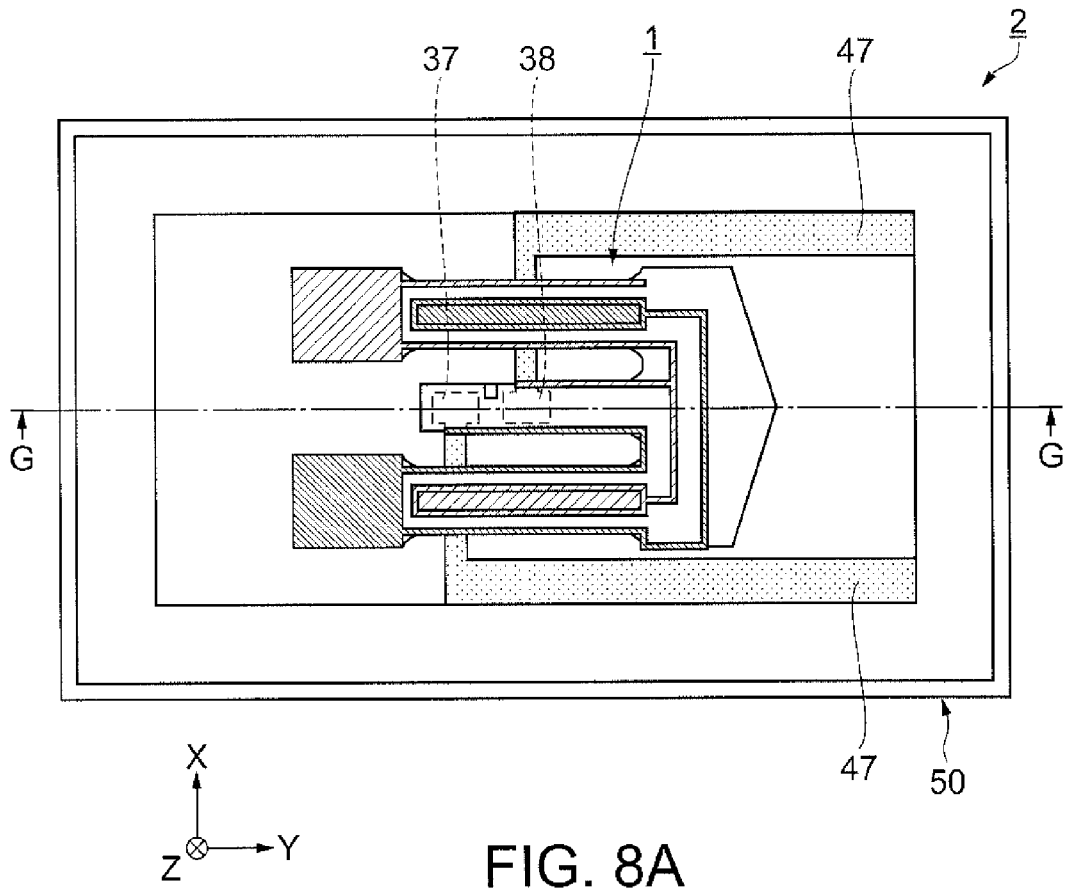
Figure 8B:
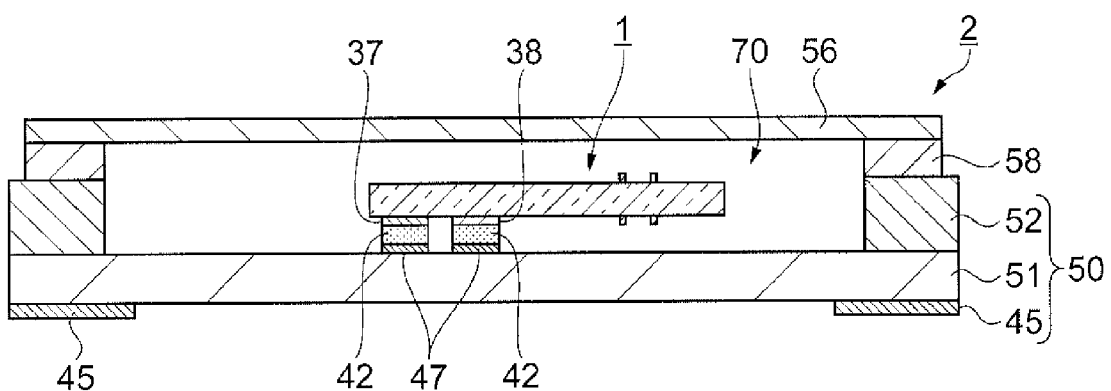

FIGS. 8A and 8B are schematic diagrams showing a structure of the resonator according to an embodiment of the invention, wherein FIG. 8A is a plan view of the resonator, and FIG. 8B is a cross-sectional view along the G-G line shown in FIG. 8A. It should be noted that in FIG. 8A, for the sake of convenience of explanation of an internal configuration of the resonator 2, there is shown a state with a lid member 56 removed.

The resonator 2 includes the resonator element 1, a package main body 50 having a rectangular box shape for housing the resonator element 1, and the lid member 56 made of, for example, glass, ceramic, or metal. It should be noted that a roughly vacuum reduced-pressure space is formed inside a cavity 70 for housing the resonator element 1.

As shown in FIG. 8B, the package main body 50 is formed by stacking a first substrate 51, a second substrate 52, and mounting terminals 45 on each other. The plurality of mounting terminals 45 is disposed on an exterior bottom surface of the first substrate 51. Further, at predetermined positions on the upper surface of the first substrate 51, there is disposed a plurality of connection electrodes 47 having electrical conduction with the mounting terminals 45 via through electrodes and inter-layer wiring patterns not shown. The second substrate 52 is a ring-like member with the central portion removed, and is provided with the cavity 70 for housing the resonator element 1.

The first substrate 51 and the second substrate 52 of the package main body 50 explained hereinabove are each formed of a material having an insulating property. Such a material is not particularly limited, and a variety of types of ceramics such as oxide ceramics, nitride ceramics, or carbide ceramics can be used. Further, each of the electrodes and terminals provided to the package main body 50, the wiring patterns and the inter-layer wiring patterns for electrically connecting these electrodes and terminals, and so on are typically disposed by printing a metal wiring pattern material such as tungsten (W) or molybdenum (Mo) on the insulating material by screen printing, calcining the material, and then executing plating of nickel (Ni), gold (Au), or the like on the material.

The lid member 56 is preferably formed of a light transmissive material such as borosilicate glass, and is bonded with a sealing material 58 to thereby airtightly seal the package main body 50. Thus, it is arranged to make it possible to perform the frequency adjustment using a mass reduction method by irradiating the tip portion of the resonator element 1 with the laser beam externally input via the lid member 56 after sealing the package main body 50 with the lid member 56 to thereby partially evaporate the electrode disposed in the tip portion. It should be noted that in the case in which such a frequency adjustment is not performed, the lid member 56 can be formed of a metal material such as a kovar alloy.

The resonator element 1 housed in the cavity 70 of the package main body 50 is aligned so that the first and second electrode pads 37, 38 disposed on the support arm 23 and the two connection electrodes 47 disposed on the upper surface of the first substrate 51 of the package main body 50 correspond to each other, and is bonded via a bonding member 42. By using an electrically-conductive bonding member such as a bump formed of metal or solder, or an electrically-conductive adhesive as the bonding member 42, mechanical bonding can be achieved while achieving electrical connection.

Electronic Device

Then, an electronic device 3 to which the resonator element 1 according to an embodiment of the invention is applied will be explained.

Figure 9:
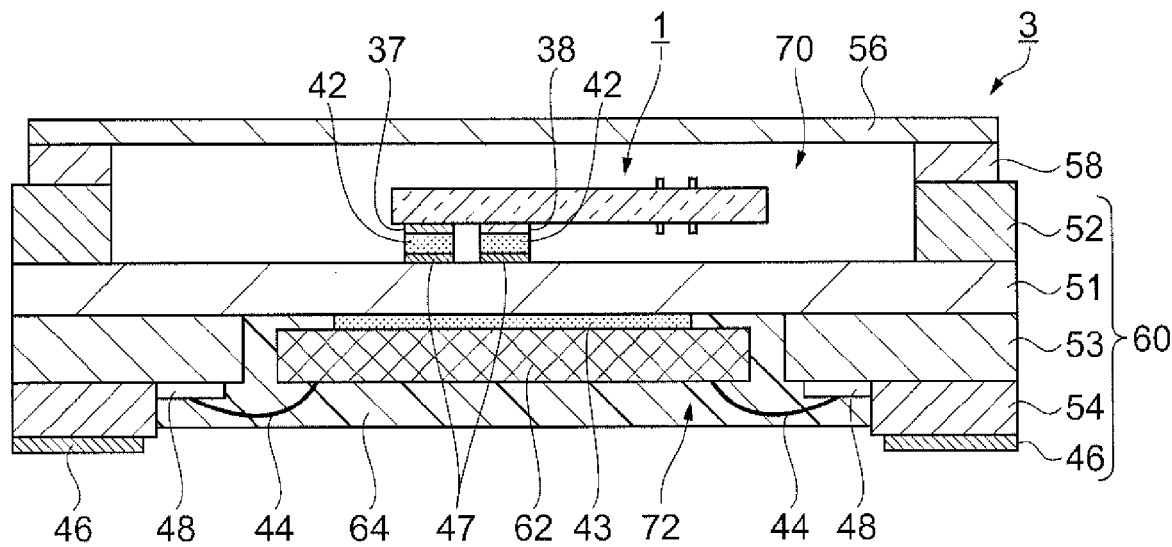
FIG. 9 is a schematic diagram showing a cross-sectional structure of an electronic device according to an embodiment of the invention.

FIG. 9 is a schematic diagram showing a cross-sectional structure of the electronic device according to the embodiment of the invention.

The electronic device 3 includes the resonator element 1, a package main body 60 for housing the resonator element 1, an IC chip (a chip part) 62 having an oscillator circuit for driving the resonator element 1, and the lid member 56 made of, for example, glass, ceramic, or metal. It should be noted that a roughly vacuum reduced-pressure space is formed inside a cavity 70 for housing the resonator element 1.

As shown in FIG. 9, the package main body 60 is formed by stacking a first substrate 51, a second substrate 52, a third substrate 53, a fourth substrate 54, mounting terminals 46 on each other. Further, the package main body 60 has the cavity 70 opening in the upper surface, and a cavity 72 opening in the lower surface.

The plurality of mounting terminals 46 is disposed on an exterior bottom surface of the fourth substrate 54. Further, the mounting terminals 46 are electrically connected to the connection electrodes 47 disposed on the upper surface of the first substrate 51 and connection terminals 48 disposed on the lower surface of the third substrate 53 via through electrodes and inter-layer wiring pattern not shown.

Similarly to the resonator 2 according to the present embodiment, the first and second electrode pads 37, 38 provided to the support arm 23 and the two connection electrodes 47 disposed on the upper surface of the first substrate 51 of the package main body 60 are aligned so as to correspond to each other, and are bonded via the bonding material 42, and then bonding is performed using the sealing material 58 such as borosilicate glass to thereby airtightly seal the cavity 70 of the package main body 60.

Meanwhile, the IC chip 62 is housed in the cavity 72 of the package main body 60, and the IC chip 62 is fixed to the lower surface of the first substrate 51 via a bonding material 43 such as brazing filler metal or an adhesive. Further, at least two connection electrodes 48 are disposed inside the cavity 72. The connection electrodes 48 are each electrically connected to the IC chip 62 with a bonding wire 44. Further, the cavity 72 is filled with a resin material 64, and the IC chip 62 is encapsulated with the resin material 64.

The IC chip 62 has a drive circuit (an oscillator circuit) for controlling drive of the resonator element 1, and by driving the resonator element 1 using the IC chip 62, a signal with a predetermined frequency can be taken out.

Electronic Apparatus

Then, electronic apparatuses to which the resonator element 1 according to the invention is applied will be explained in detail based on FIGS. 10 through 12.

Figure 10:
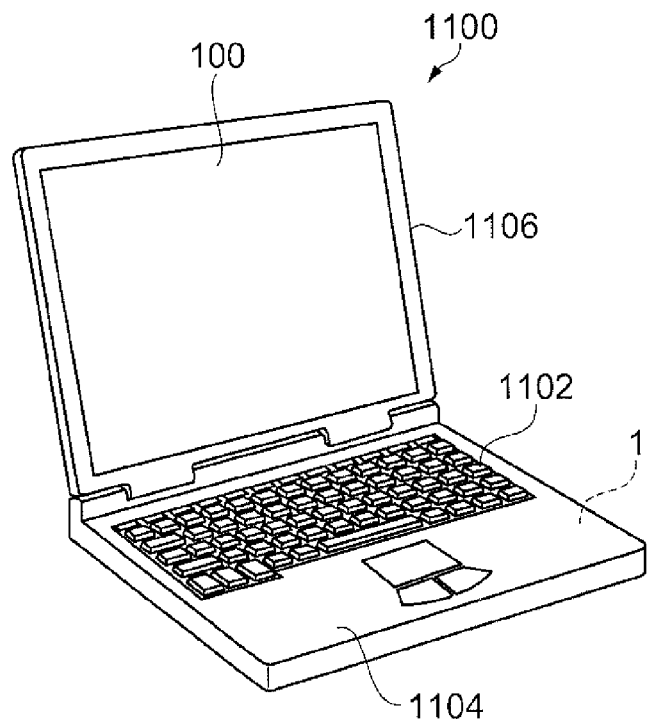
FIG. 10 is a perspective view showing a configuration of a mobile type (or a laptop type) personal computer as an electronic apparatus equipped with the resonator element according to the invention.

FIG. 10 is a perspective view showing a configuration of a mobile type (or a laptop type) personal computer as an electronic apparatus equipped with the resonator element according to the invention. In the drawing, the personal computer 1100 includes a main body section 1104 provided with a keyboard 1102, and a display unit 1106 provided with a display section 100, and the display unit 1106 is pivotally supported with respect to the main body section 1104 via a hinge structure. Such a personal computer 1100 incorporates the resonator element 1.

Figure 11:
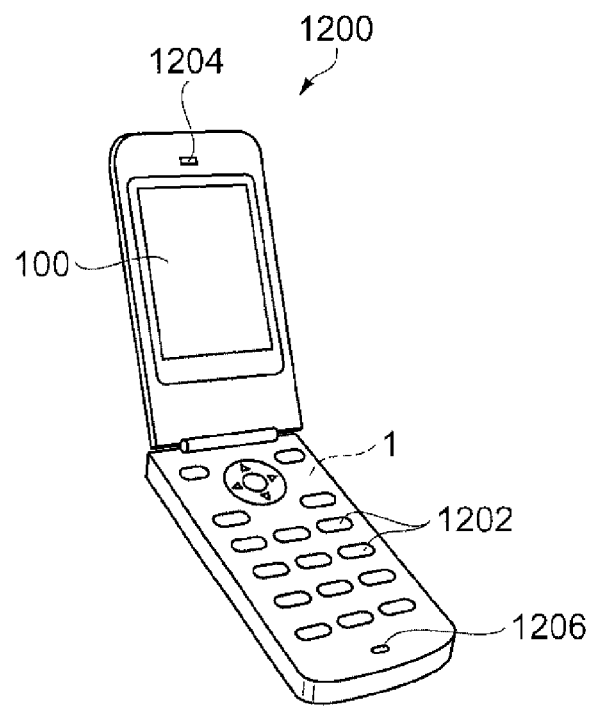
FIG. 11 is a perspective view showing a configuration of a cellular phone (including PHS) as an electronic apparatus equipped with the resonator element according to the invention.

FIG. 11 is a perspective view showing a configuration of a cellular phone (including PHS) as an electronic apparatus equipped with the resonator element according to the invention. In this drawing, the cellular phone 1200 is provided with a plurality of operation buttons 1202, an ear piece 1204, and a mouthpiece 1206, and the display section 100 is disposed between the operation buttons 1202 and the ear piece 1204. Such a cellular phone 1200 incorporates the resonator element 1.

Figure 12:
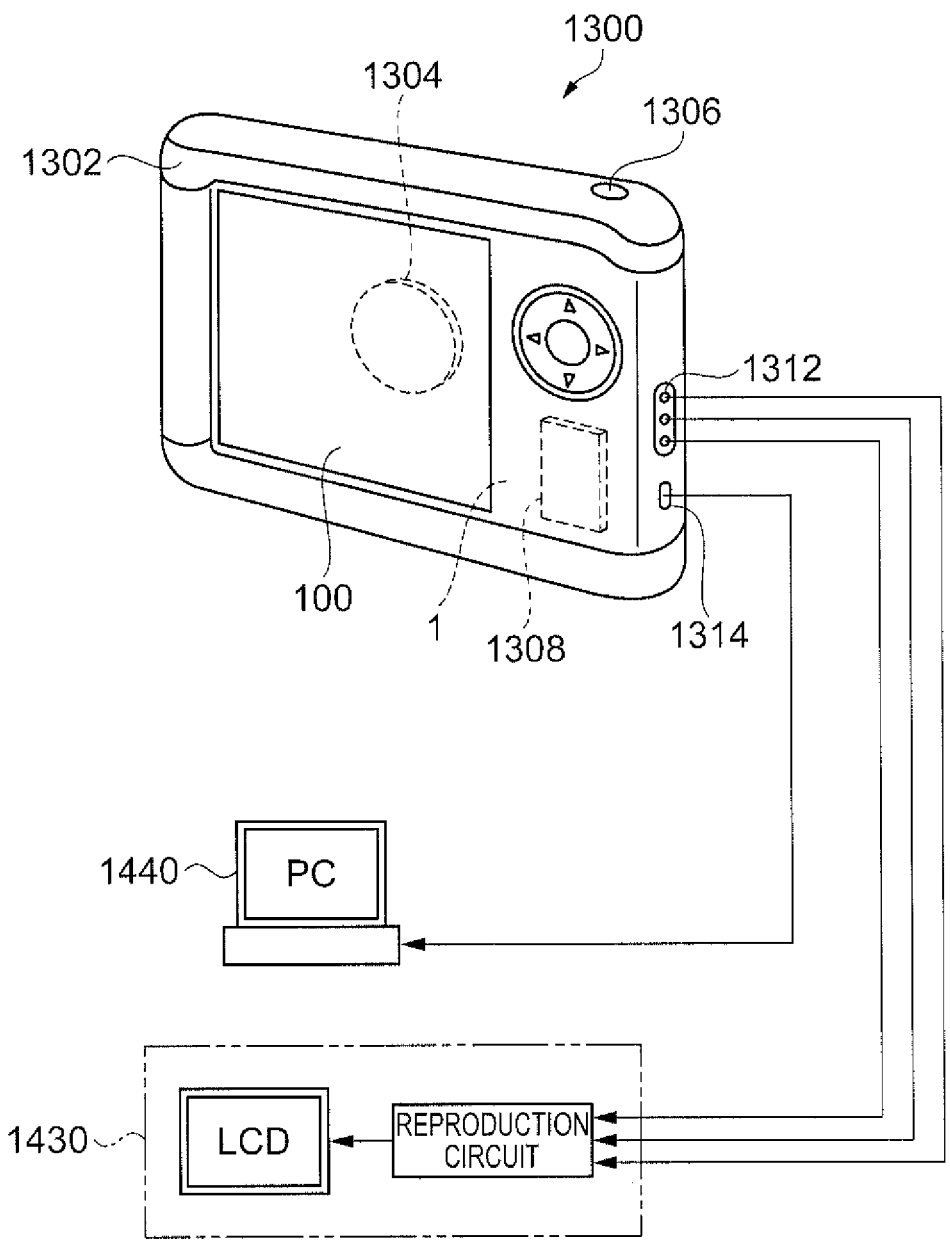
FIG. 12 is a perspective view showing a configuration of a digital camera as an electronic apparatus equipped with the resonator element according to the invention.

FIG. 12 is a perspective view showing a configuration of a digital camera as an electronic apparatus equipped with the resonator element according to the invention. It should be noted that the connection with external equipment is also shown briefly in this drawing. Here, an ordinary camera exposes a silver salt film to an optical image of an object, while the digital camera 1300 performs photoelectric conversion on an optical image of an object by an imaging element such as a charge coupled device (CCD) to generate an imaging signal (an image signal).

A case (a body) 1302 of the digital camera 1300 is provided with the display section 100 disposed on the back surface thereof to have a configuration of performing display in accordance with the imaging signal from the CCD, wherein the display section 100 functions as a viewfinder for displaying the object as an electronic image. Further, the front surface (the reverse side in the drawing) of the case 1302 is provided with a light receiving unit 1304 including an optical lens (an imaging optical system), the CCD, and so on.

When the photographer checks an object image displayed on the display section 100, and then holds down a shutter button 1306, the imaging signal from the CCD at that moment is transferred to and stored in a memory device 1308. Further, the digital camera 1300 is provided with video signal output terminals 1312 and an input/output terminal 1314 for data communication disposed on a side surface of the case 1302.

Further, as shown in the drawing, a television monitor 1430 and a personal computer (PC) 1440 are respectively connected to the video signal output terminals 1312 and the input/output terminal 1314 for data communication as needed. Further, there is adopted the configuration in which the imaging signal stored in the memory device 1308 is output to the television monitor 1430 and the personal computer 1440 in accordance with a predetermined operation. Such a digital still camera 1300 incorporates the resonator element 1.

It should be noted that, besides the personal computer (the mobile personal computer) shown in FIG. 10, the cellular phone shown in FIG. 11, and the digital camera shown in FIG. 12, as the electronic apparatus equipped with the resonator element 1 according to the invention, there can be cited, for example, an inkjet ejection device (e.g., an inkjet printer), a laptop personal computer, a television set, a video camera, a video cassette recorder, a car navigation system, a pager, a personal digital assistance (including one with communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator.

Moving Object

Then, a moving object to which the resonator element 1 according to the invention is applied will be explained.

Figure 13:
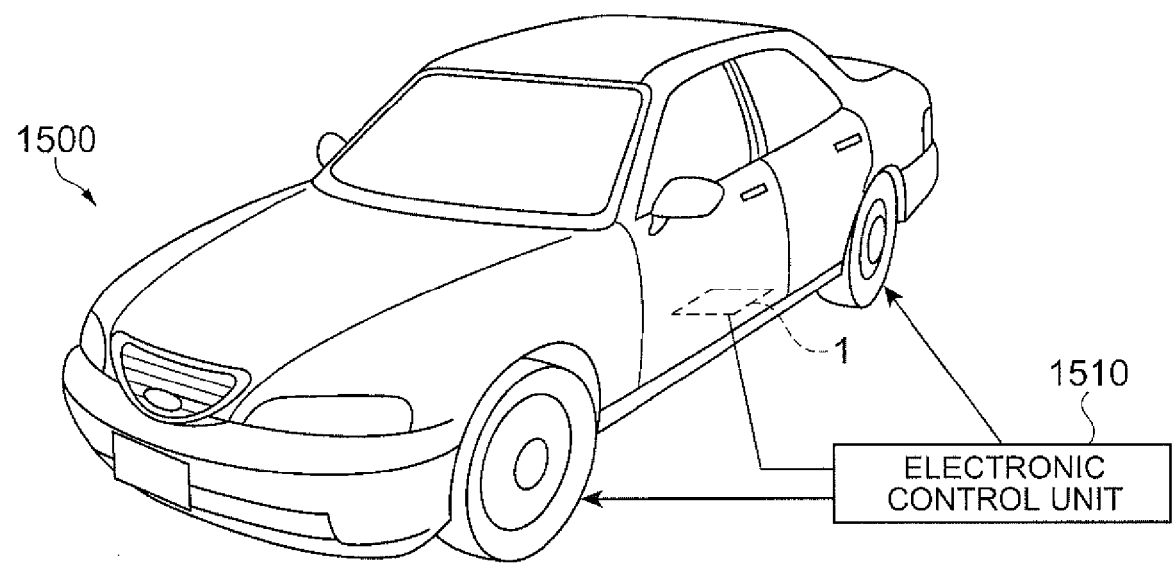
FIG. 13 is a perspective view showing a configuration of a vehicle as a moving object equipped with the resonator element according to the invention.
Figure 14A:
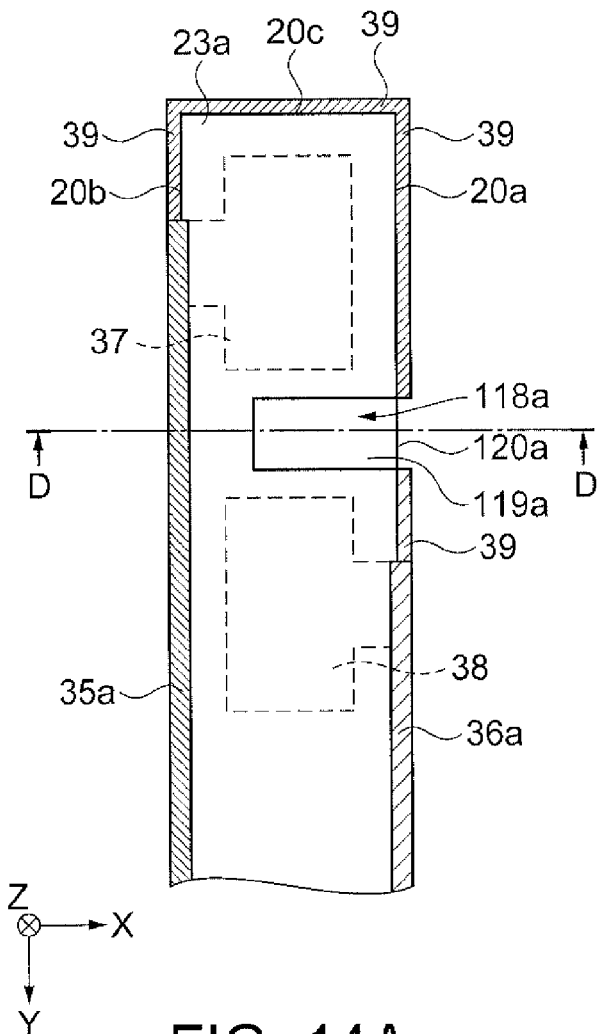
Figure 14B:
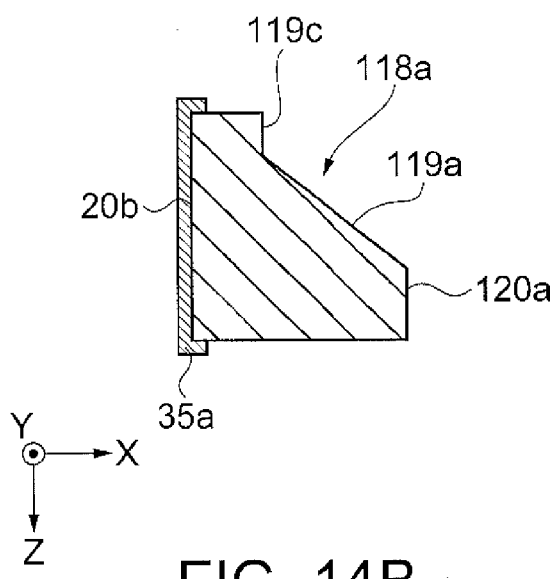

FIG. 13 is a perspective view schematically showing a vehicle as an example of the moving object according to the invention. The vehicle 1500 is equipped with the resonator element 1. The resonator element 1 can widely be applied to an electronic control unit (ECU) 1510 such as a keyless entry system, an immobilizer, a car navigation system, a car air-conditioner, an anti-lock brake system (ABS), an air-bag system, a tire pressure monitoring system (TPMS), an engine controller, a battery monitor for a hybrid car or an electric car, or a vehicle posture control system.

Although the resonator element 1, the resonator 2, the electronic device 3, the electronic apparatus, and the moving object according to the invention are hereinabove explained based on the embodiments shown in the accompanying drawings, the invention is not limited to these embodiments, but the configuration of each of the components can be replaced with one having an arbitrary configuration with an equivalent function. Further, it is also possible to add any other constituents to the invention. Further, it is also possible to arbitrarily combine any of the embodiments.

What is claimed is:

1. A quartz crystal resonator element comprising:
   a base section;
   a pair of vibrating arms extending from an end portion of the base section in a first direction, and arranged side by side in a second direction intersecting with the first direction; and
   a support arm extending from the end portion of the base section in the first direction, and arranged between the pair of vibrating arms,
   the support arm including:
   a cut section formed in a side surface on a +X-axis side of the support arm by cutting the support arm along a −X-axis direction, and including a convex tilted portion including a first tilted surface extending from an −X-axis side toward a +X-axis side and tilted from a −Z-axis side of a Z axis toward a +Z-axis side along the +X-axis direction and a second tilted surface extending from the −X-axis side toward the +X-axis side and tilted from the +Z-axis side toward the −Z-axis side, a first electrode pad and a second electrode pad having polarities opposite to each other, and a first extraction electrode and a second extraction electrode disposed on a side surface of the support arm on the +X-axis side among side surfaces intersecting with a crystal X axis of the quartz crystal, and connected respectively to the first electrode pad and the second electrode pad, and the first extraction electrode and the second extraction electrode are electrically separated from each other in the cut section.

2. The quartz crystal resonator element according to claim 1, wherein
the first tilted surface and the second tilted surface are each tilted in a stepwise fashion.

3. The quartz crystal resonator element according to claim 1, wherein
the cut section is disposed at least one of between the first electrode pad and the second electrode pad and between a tip of the support arm and the first electrode pad in a planar view.

4. The quartz crystal resonator element according to claim 1, wherein
the first tilted surface and the second tilted surface overlap each other in a planar view.

5. The quartz crystal resonator element according to claim 1, wherein
a length L1 of the cut section along a crystal Y-axis direction is 5 μm or more and 500 μm or less.

6. The quartz crystal resonator element according to claim 5, wherein
the length L1 is 20 μm or more and 100 μm or less.

7. The quartz crystal resonator element according to claim 1, wherein
a width W1 of the cut section along a crystal X-axis direction is 5 μm or more and 300 μm or less.

8. The quartz crystal resonator element according to claim 7, wherein
the width W1 is 10 μm or more and 50 μm or less.

9. The quartz crystal resonator element according to claim 1, wherein
a plurality of the cut sections are provided to the support arm.

10. A resonator comprising:
the resonator element according to claim 1; and
a container adapted to house the resonator element.

11. A resonator comprising:
the resonator element according to claim 2; and
a container adapted to house the resonator element.

12. An electronic device comprising:
the resonator element according to claim 1; and
a circuit.

13. An electronic device comprising:
the resonator element according to claim 2; and
a circuit.

14. An electronic apparatus comprising:
the resonator element according to claim 1.

15. An electronic apparatus comprising:
the resonator element according to claim 2.

16. A moving object comprising:
the resonator element according to claim 1.

17. A moving object comprising:
the resonator element according to claim 2.

18. A quartz crystal resonator element comprising:
a base section;
a pair of vibrating arms extending from an end portion of the base section in a first direction, and arranged side by side in a second direction intersecting with the first direction; and
a support arm extending from the end portion of the base section in the first direction, and arranged between the pair of vibrating arms,
the support arm including:
a cut section formed in a side surface on a +X-axis side of the support arm by cutting the support arm along a −X-axis direction, and including a first tilted surface and a second tilted surface separated by a flat surface extending in a z axis direction, the first tilted surface and the second tilted surface being tilted at angles with respect to the flat surface,
a first electrode pad and a second electrode pad having polarities opposite to each other, and
a first extraction electrode and a second extraction electrode disposed on a side surface of the support arm, and connected respectively to the first electrode pad and the second electrode pad, and
the first extraction electrode and the second extraction electrode are electrically separated from each other in the cut section.

\* \* \* \* \*